United States Patent [19]
Groves et al.

[11] Patent Number: 4,588,945
[45] Date of Patent: May 13, 1986

[54] HIGH THROUGHPUT CIRCUIT TESTER AND TEST TECHNIQUE AVOIDING OVERDRIVING DAMAGE

[75] Inventors: William A. Groves; Vance R. Harwood, both of Loveland; Thomas R. Fay, Fort Collins; Elton C. Bingham; Michael A. Teska, both of Loveland, all of Colo.

[73] Assignee: Hewlett-Packard Company, Palo Alto, Calif.

[21] Appl. No.: 503,465

[22] Filed: Jun. 13, 1983

[51] Int. Cl.[4] ............................................. G01R 15/12
[52] U.S. Cl. ............................. 324/158 R; 324/73 R; 364/481; 371/20; 371/25
[58] Field of Search ......... 324/158 R, 73 PC, 73 AT, 324/105, 158 T, 73 R; 364/481; 371/20, 25

[56] References Cited
U.S. PATENT DOCUMENTS 3,870,953  3/1975  Boatman et al. ................... 324/73 R
4,507,576  3/1985  McCracken et al. ........ 324/73 R X

OTHER PUBLICATIONS

Hansen, P., "Functional and In-Circuit Testing . . . ", Electronics, Apr. 21, 1981, pp. 189-195.
Carrol, M. et al., "In Circuit Tester Takes on ECL, TTL, and MOS Devices", Electronic Design, vol. 29, No. 11, May 1981, pp. 91-97.
Tom E. Finnell, "In-Circuit Testing of LSI-Based PCBs", Electronic Production, Sep. 1982, p. 47.

Primary Examiner—Stewart J. Levy
Assistant Examiner—Stephen M. Baker
Attorney, Agent, or Firm—Bloor Redding, Jr.; John A. Frazzini

[57] ABSTRACT

A method and apparatus are disclosed for reducing the likelihood of damage to digital logic devices under test or located in close electrical proximity to the device under test while attempting to locate faults in circuit assemblies using digital incircuit test techniques.

8 Claims, 10 Drawing Figures

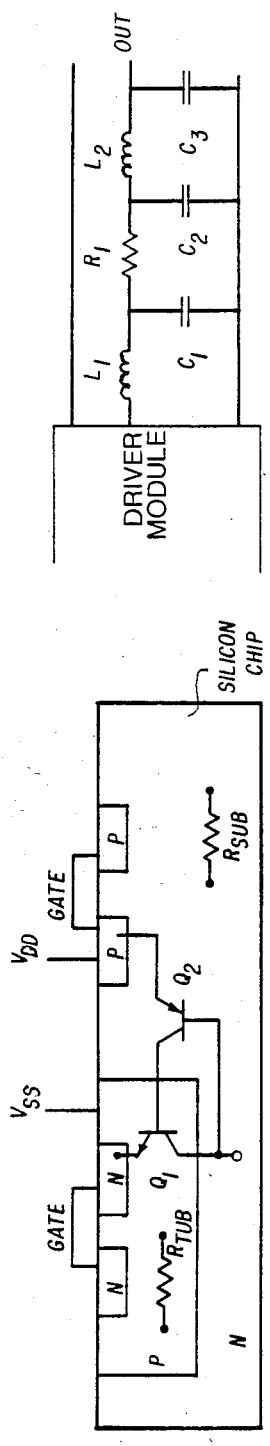
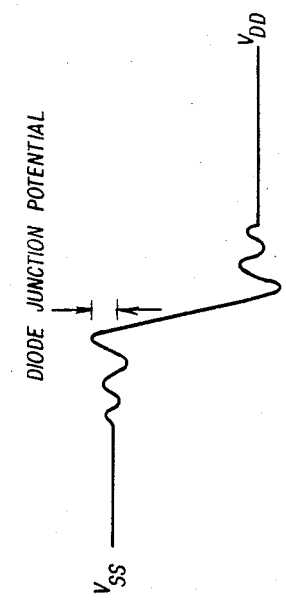
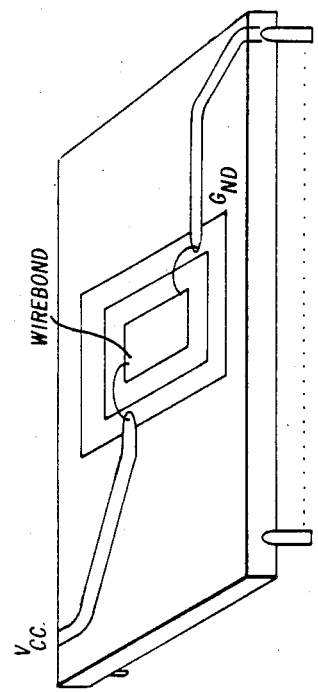
FIG 5
FIG 8
FIG 4
FIG 6

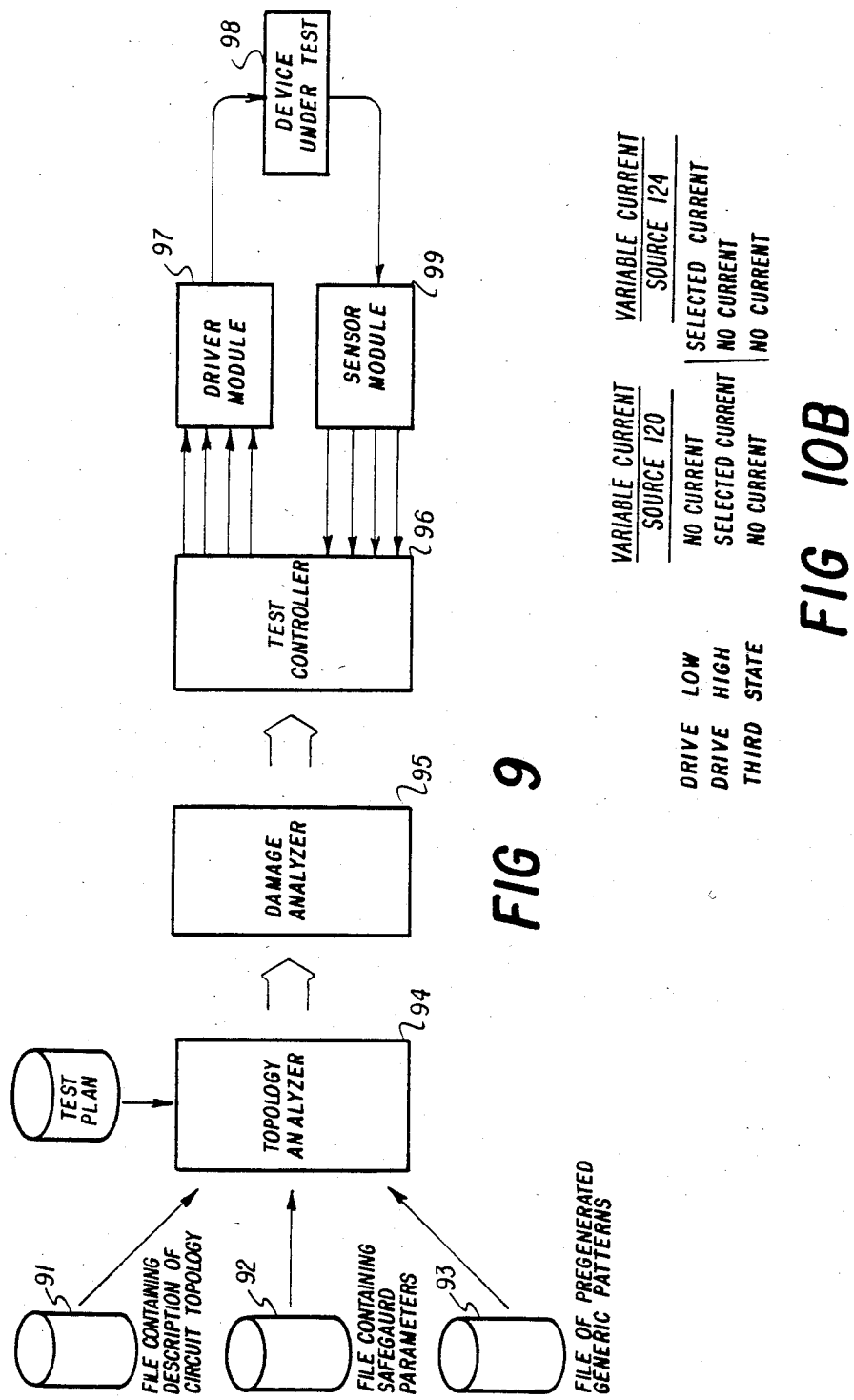

$R_{jd}$ = THERMAL RESISTANCE, JUNCTION TO DIE
$R_{dc}$ = THERMAL RESISTANCE, DIE TO CASE (PACKAGE)
$R_{ca}$ = THERMAL RESISTANCE, CASE TO AMBIENT $C_j$ = THERMAL CAPACITY, JUNCTION
$C_d$ = THERMAL CAPACITY, DIE
$C_c$ = THERMAL CAPACITY, CASE (PACKAGE)

HIGH THROUGHPUT CIRCUIT TESTER AND TEST TECHNIQUE AVOIDING OVERDRIVING DAMAGE

BACKGROUND OF THE INVENTION

The increasing use of digital logic in circuit assemblies and the increasing complexity of these digital logic circuits has generated a search for test techniques other than the traditional "functional test" methods that apply digital patterns to the circuit assembly inputs and compare the response from the circuit assembly outputs to expected values. These functional test input signals may be complex and difficult to specify properly since they must cause digital circuit activity to propogate from the circuit assembly inputs through various digital devices to the site of a potential fault and further cause transmission of signals from the fault site to the assembly output. One alternative technique is known as "incircuit" testing. In this technique, one applies a digital pattern directly to the device under test, and detects the output from that device in order to verify proper operation. Early implementation of such a technique using a probe is described in the September 1972 issue of the Hewlett-Packard Journal in an article entitled "Logic Pulser and Probe: a New Digital Troubleshooting Team", By Robin Adler and Jan R. Holland. The implementation of such a technique is the subject of U.S. Pat. Nos. 3,543,154; 3,641,509; 3,670,235; 3,781,689; and 3,965,468.

Further developments have occurred in the class of test equipment using this test technique. These developments include the ability to pulse more than one node or device at one time, the ability to pulse larger numbers of patterns in order to test more complex devices, the ability to handle third state data and others. Such equipment is manufactured by GenRad, Inc., Concord, Mass. The implementation of such techniques are described in U.S. Pat. Nos. 3,870,953; 4,236,246.

The implementation of the "incircuit" test technique requires application of a pattern directly to the device under test and measurement of the response from the device. Since digital logic circuits, except those at the input or output of the circuit assembly, are generally connected to other digital logic circuits, the application of the pattern requires overdriving the pattern which is applied by the "upstream" logic devices during normal device operation. Upstream logic devices are those devices whose outputs drive the inputs of the device under test.

FIG. 1 represents a prior art design. Prior art techniques of pattern application involve taking a file of generic patterns for a specific device, combining it with a topological description of the board, and applying these patterns device by device to the board under test. The design is capable of providing a sequence of patterns to the device under test for suitable periods long enough to test the individual device. Between each test, there is a delay caused by automatic tester overhead and used for the protection of devices. These fixed periods of time permit devices upstream to cool. However, several problems are apparent. First, the fixed time period between tests, unrelated to the actual time necessary for the devices upstream to cool, reduces throughput. Second, in order to test certain complex logic devices, it is necessary to first place these devices into a known state before beginning the test. This process, known as "homing", consists of applying a pattern or a short series of patterns of input signals, until the device responds with a certain predetermined pattern of output signals. When this pattern has been received, the device is in a known state or homed. However, if the device fails to home because of a defect, the homing pattern would be applied continuously until a fail safe timer in the circuit tester shuts down the hardware. The fail safe timer is designed to prevent the tester from applying a set of patterns indefinitely and is usually set for the maximum possible test time for the entire test sequence to be applied. This could be long after upstream devices have been damaged. Third, the drivers used in the prior art have no provision for the control of overshoot which increases the risk of CMOS "latch up". All of these problems and more are resolved by the methods and apparatus to be described below.

SUMMARY OF INVENTION

One of the primary concerns of the incircuit test technique is the possibility of damage to the devices which are "up-stream". Since the patterns are applied directly to the device under test, this necessitates that the outputs of the up-stream device be overdriven (FIG. 2). This may lead to damaging the device through various mechanisms including three specific damage mechanisms: CMOS "latchup", Bond Wire Fusing, and Device damage through die Heating. A discussion of these and other mechanisms appear in the Appendix.

CMOS "latchup" is a self destructive property of CMOS logic. The damage is caused by the formation of a parasitic SCR. Once the parasitic SCR has turned on, it conducts large amounts of current from Vdd to Vss which causes large power dissipation which in turn destroys the device. Vdd and Vss are voltages on the supply rails (i.e., the connections to the power supplies). Once the parasitic SCR has turned on, it will remain on until power is removed from the device or the device fails. Referring to FIG. 3, observe that the SCR is formed by the positive feedback of a NPN-PNP series transistor pair Q1-Q2. FIG. 4 shows that Q1 is the vertical NPN transistor formed by the N+ Source (emitter), the P-Tub (base) and the N-Sub (collector). Q2 is the lateral PNP formed by the P+ Source (emitter), the N-Sub (base) and the P-Tub (collector). R-Sub is the spreading resistance encountered by a current in the N-Sub material from a carrier source to a N+ contact. R-Tub is the spreading resistance encountered by a current in the P-Tub from a carrier source to a P+ contact. With either Q1 or Q2 turned on, the circuit will have positive feedback as long as the beta of the vertical transistor times the beta of the horizontal transistor is greater than unity. Note that a small current through R-Sub or R-Tub can start the positive feedback process.

CMOS "latchup" may be caused during incircuit tests by allowing a voltage, which exceeds either supply rail of the device by one diode junction potential, to be applied to the output of the upstream device or to the input of the device under test. Such voltages are caused by the driver of the test apparatus under certain conditions. FIG. 5 shows a driver which is connected to the device under test through wire of various lengths. This wire has inductance. Capacitance is present between the wires connecting the driver to the device under test. FIG. 6 illustrates that when the driver applies a low or a high signal, this inductance and capacitance can cause overshoot. If this overshoot exceeds the diode junction potential, then current will be injected into the substrate or tub causing current which will lead to CMOS "latchup".

Bond Wire fusing is caused by excessive heating of the bond wires. It can occur on a device upstream from the device under test. FIG. 7 is a schematic of the output stage of a standard TTL device. This device represents an output stage of a device upstream from a device under test. If the device is attempting to apply a "false" or logic level 0 to the device under test, and the driver is attempting to apply a "true" or logic level 1 to the device under test, there will be a large current drawn through the lower transistor of the output driver. This is a highly likely occurrence during portions of an incircuit test sequence. There may be a multiplicity of devices upstream from the device under test. If several of these devices are located in the same package, then the high currents through this package may cause damage. While the currents through the output bond wire will usually be in a safe region because only one overdrive current flows through such wire, currents through the Vcc and Vdd supply lines are additive and if more than one output of the same package is overdriven in the same direction, then the current through these supply lines will add. The large amount of currents flowing through the supply bond wire will cause resistive heating, and if this occurs for long enough, the bond wire will melt similar to a fuse. Once this occurs the device is ruined.

Devices may also be damaged through die heating. Die heating is caused in the upstream device by a process which is similar to wire bond fusing. Refering again to FIG. 7, the lower transistor in the totem pole is turned on attempting to sink current from the output until the output approximately equals the supply voltage. The transistor is normally driven into saturation and the voltage drop across the transistor is small. After the current has been switched, the current through the device is low, so that the power dissipated in the transister is low. However, when the device is being overdriven, the transistor is brought out of saturation and into the active region where the voltage across the transistor instead of being small is approximately equal to the difference between the output and supply rail. As stated above the current through the transistor is also high, thereby resulting in a large power dissipation. The ability to handle this power dissipation depends on several factors. First, how many outputs in the package that are connected to the device under test are being overdriven. Second, what type of package (for example, ceramic or plastic) is the device held in, and third, how the chip is attached to the package. The type of package and the method of attachment are often combined into a factor known as the thermal resistance. These factors are known as safeguard parameters. If the device is permitted to heat up to too high a temperature, then the output transistor will be damaged. This damage may appear immediately as a bad device at the time of test or it may appear later as significantly reduced operational lifetime of that device.

The invention represents an improved method of pattern application which permits increased throughput while decreasing the risk of damage to the device under test and to the devices upstream from the device under test.

Among the features of the invention are:
1. A method of reducing the overshoot or undershoot on inputs or outputs of a CMOS device without reducing driver voltage.
2. A method of identifying which test will potentially damage devices and preventing those tests from being executed.
3. A method of selecting an inter-test delay necessary to protect the device from damage while increasing throughput.
4. A method of preventing damage caused by homing a device which fails to home.

DRAWINGS

The invention will now be described in connection with the accompaning drawings.

FIGS. 3, 4, 5 and 6 illustrate the causes of CMOS "latch-up".

FIGS. 7 and 8 illustrate the effect of overdriving an upstream device.

FIG. 9 is a block diagram of a preferred test system apparatus operating in accordance with the method of the invention.

DESCRIPTION OF THE INVENTION

Figure 1:
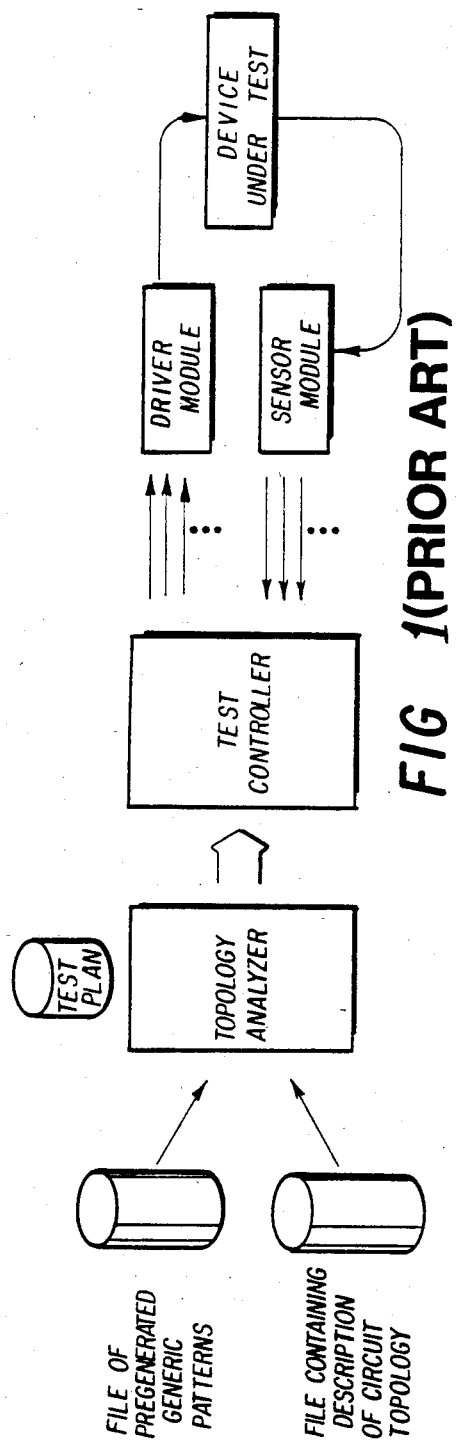
FIG. 1 is a general illustration of a prior art technique.
Figure 2:
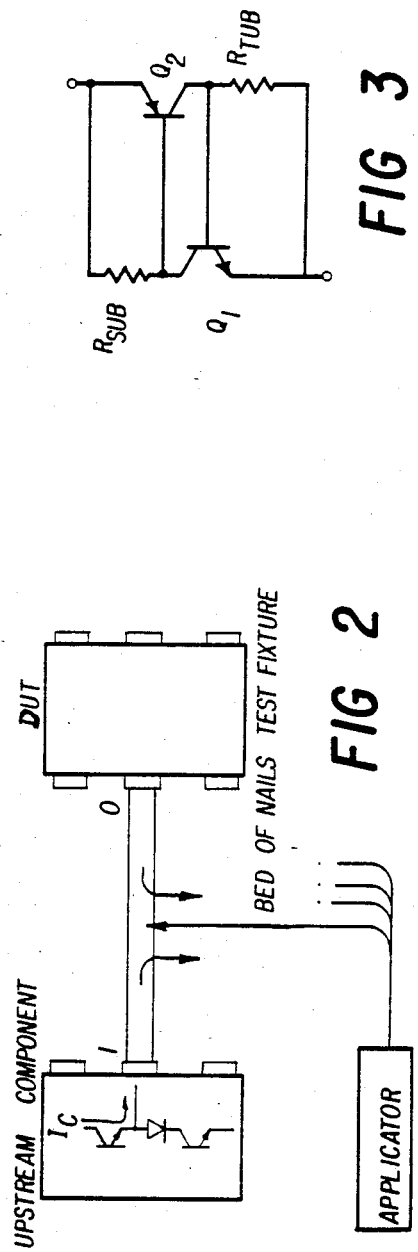
FIG. 2 is an illustration of the effect of overdriving a node.
Figure 3:
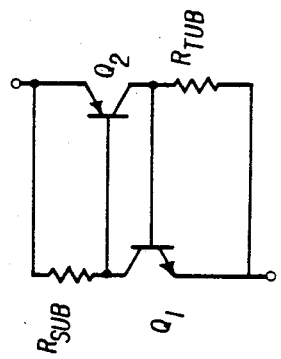

FIG. 9 shows part of the improved test apparatus. The process of applying the patterns begins with three input files 91–93. File 91 contains a topological description of the board under test, File 92 contains a set of safeguard parameters for each of the devices on the board under test, and File 93 contains a set of pregenerated generic patterns for each of the devices under test. These files are then analyzed by a topological analyzer 94. This analyzer, among other things, sorts through the generic patterns and selects patterns which are suitable for testing the device and selects the driver module to be used with this device. These patterns, along with the topological and safeguard data are passed on to a damage analyzer 95.

Damage analyzer 95 is responsible for, among other things, the calculation of the time interval the test will require, a determination of whether the test may possibly damage upstream components, and calculation of the required variable inter-test delay times. This data, along with the safeguard parameters, is passed to a controller 96.

Controller 96 applies the patterns to a device under test 98 through a driver module 97, receives the response of device under test 98 through a sensor module 99 and compares this response to an expected response. The controller inserts the variable inter-test delays in order to protect devices upstream from damage.

Driver module 97 must be capable of overdriving the output of the upstream device. However, driver 97 must be capable of controlling overshoot in order to prevent CMOS "latchup".

In order to overdrive devices without causing damage through bond wire fusing or die overheating, the application of patterns must be analyzed in two steps. First, the test must not be so long as to cause overheating or damage. Second, the tests of two devices, one after the other, must not be so close in time as to cause the damage. In order to prevent the first type of damage, a maximum allowable test duration is determined. If the length of the test exceeds the maximum allowable test duration, then the test is flagged not to be executed. To determine the maximum allowable test duration, damage analyzer 95 examines the maximum test time for both bond wire fusing and die overheating. In order to prevent the second damage phenomenon, the minimum allowable cooling delay is calculated by damage analyzer 95 and used by test controller 96 between tests to assure that no number of test when combined will exceed the maximum allowable temperatures for the devices. Again the analysis is done for both bond wire fusing and die overheating types of damage.

The maximum overdrive duration due to bond wire overheating constraints is a function primarily of package material and the amount to overdrive current through the supply lines. This duration limit is calculated by damage analyzer 95 for each supply pin of the upstream devices. Then the minimum of these duration times is used by the damage analyzer to determine the maximum test duration. The following formula is used to calculate the delay for each supply pin:

For ceramic packages:

$$\text{max time} = -0.00716 * \ln(1 - 0.3865/((Np*I)/Nw)**2)$$

For plastic packages:

$$\text{max time} = -0.00129 * \ln(1 - 2.825/((Np*I)/Nw)**2)$$

Where:
  Np = The number of device outputs being overdriven and causing current to flow through this supply pin.
  I = The amount of current caused by each overdriven output.
  Nw = The number of bond wires absorbing the overdrive current.

The preferred embodiment of the algorithm uses worst case analysis for Np and it estimates the Np for the upstream device to be the lesser of the number of outputs attached to the device under test inputs or the maximum number of outputs which could be functioning at a state requiring overdriving by the tester. The maximum number of outputs which could be functioning at a state requiring overdriving and the overdrive current per output for each bond wire are device dependent paramenters which are provided by file 92.

The maximum overdrive duration is also constrained by die overheating considerations. This duration is a function of the thermal resistance of the package, the power being dissipated in the output transistor, and the number of overdriven outputs in the device. The maximum duration of such a test is calculated as follows:

$$\text{max time} = (-Rjc/2000) * \ln(1 - 25/(Rjc*Pw*Np))$$

Where:
  Rjc = The junction to case thermal resistance.
  Pw = The power dissipated by each overdriven output.
  Np = The number of overdriven outputs on the device.

Again the preferred embodiment uses a worst case analysis. Np will be estimated for each upstream device as the number of its outputs attached to the device under test inputs. Rjc and Pw are both device dependent paramenters supplied by file 92. The maximum duration for a test is the minimum duration due to wire bond heating or due to die heating.

The device thermal analysis by damage analyzer 95 keeps track of the effects of a sequence of device tests on each overdriven device's temperature. For each device test, each of the devices it overdrives will be analyzed in turn to calculate the longest cool down delay such that each of those overdriven devices can recover from the effects of the test.

The delay may be placed either before or after the test for which the delay was calculated. However, cooling before the test offers an advantage because only the heating caused by the next test to be performed is important. If cooling is done after performing the test, then either the cooling calculation must cool for the duration required for the worst case heating or else the heating caused by the next test must be known. Use of cooling before, means the device is allowed to cool for only as long as necessary for the next test to be performed and reduces the amount of calculations necessary to keep the temperature from exceeding a certain value selected to protect the circuit. The maximum temperature permitted by the preferred embodiment for any device is 40 degrees Celsius above ambient and this assumption is reflected in the calculations below.

Two different types of cool down delays are used. The first type of cool down delay is calculated on the assumption that a test on this component has not been continuously repeated in a test program loop more than a hundred times. Furthermore, these delays are calculated assuming that die cooling, under either the first or second delay calculation, will exceed the time necessary for bond wire cooling. It is calculated using the following formula:

$$\text{Temp rise} = Pw*Rjc*Np*(1 - e**(-2000*Ton/Rjc))$$

$$\text{normal delay} = -(Rjc/2000) * \ln(1 - \text{Temp rise}/40)$$

Where:
  Pw = The instantaneous power absorbed by one device output pin being overdriven.
  Np = The number of pins on the device being overdriven.
  Rjc = The case/junction thermal resistance for the package class.
  Ton = The time duration of pattern application.

Pw and Rjc are package dependant. Np will be estimated as the number of device outputs connected to inputs on the device under test. The parameter Ton will be calculated for each test as a function of the pattern cycle time.

The second type of cool down delay is used when a test is being continuously looped. This calculation ensures that the duty cycle will not cause the average power fed into the overdriven device to exceed its steady state capacity to dissipate power. In either case minimum delay is the tester overhead and the maximum delay is five times the package time constant. The steady state delay is calculated as follows:

$$\text{steady state delay} = Ton*(Pw*Np*(Rjc+100)/15 - 1)$$

Ceramic packages provide less heat dissipation for bond wires, because the bond wires are not encapsulated. For this reason the cooling time constant for ceramic packages is slow enough that bond wire cooling delay will override both the normal and steady state delays, based on die heating, discussed above. The bond wire cooling delay is never allowed to exceed 5 times the cooling time constant for ceramic packages. Again, the analysis assumes the bond wire temperature is the maximum allowed. If the current test will cause a rise in excess of 200 degrees Celcius, the maximum time constant will be used. Otherwise the following formula will be used:

Bond Temp$=517.5*(I*Np)**2*(1-e**(-\text{Ton}/0.00716))$

Bond Cool$=-0.00716* \ln (1-\text{Bond Temp}/200)$

The delay calculated is in seconds.

In order to prevent damage during homing of a device having a fault which prevents it from going into a known state, the homing capability in controller 96 includes a maximum loop count. If the device never meets the exit conditions specified in the homing loop, the homing loop will execute once more after the loop count is exhausted. From the exact number of homing loops it is possible to compute the exact time of the homing sequence. Note that this is different than the fail safe timer which shuts down the hardware after a long time has gone by. The fail safe time must be set for the maximum total test time otherwise it might shut a good test off prematurely. The preferred method of homing is superior since the homing time is separate from the fail safe time and need only be as long as necessary to home the device.

In order to use the variable delays which were calculated above, the test controller must be capable of measuring the time since the last pattern is applied. These timers are activated at the end of the last test and the cool down period must pass before the next device test is started.

Figure 10A:
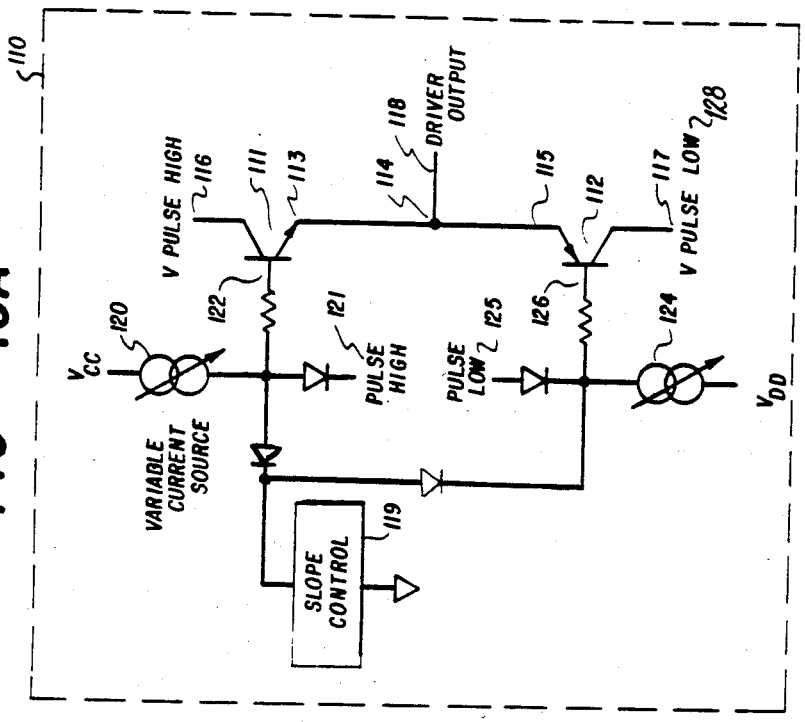
FIG. 10 is a block diagram of a driver module which reduces the overshoot and undershoot in accordance with the apparatus described below.
Figure 7:
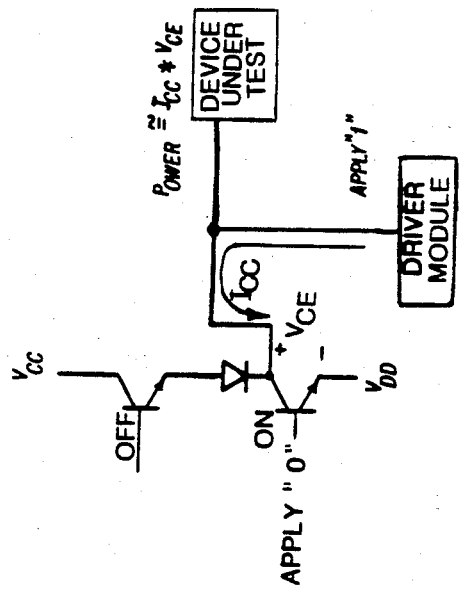

FIG. 10A shows a driver circuit 110 utilized in driver module 97. Driver module 97 consists of a multiplicity of identical driver circuits 110 which are assigned by topological analyzer 94 to inputs of a device under test 98. These circuits are responsible for converting the internal true, false and third state signals of a test sequence in test controller 96 to the physical voltage signals which are understood by the device under test. Driver circuit 110 also is capable of controlling the slope of the voltage signal through the use of a pair of variable current drive sources 120 and 124 under the control of controller 96 and a slope controller 119.

Drive circuit 110 utilizes a transistor 111 connected in series with a transistor 112. The emitter 113 of transistor 111 is connected at a node 114 to the emitter 115 of transistor 112. Collector 116 of transistor 111 is connected to a source 121 of voltage $V_{pulse\ high}$ and collector 117 of transistor 112 is connected to a voltage source 124 of voltage $V_{pulse\ low}$. Driver output 118 is connected to node 114 to provide the driver output signals.

To prevent CMOS latchup, the slope of the driver output signals is limited by use of a slope controller 119 and a variable current source 120 which are connected to base 122 of transistor 111. Slope control is also effected by use of a slope controller 119 and a variable current source 124 which are connected to gate 126 of transistor 112. When controller 96 changes the current supplied by source 120, the rate of change of the voltage applied to base 122 is limited by slope control 119. In the preferred embodiment, slope control 119 is a capacitor of sufficient size to limit the slope of the driver output signal sufficiently to avoid CMOS latch-up. Similarly, the combination of slope control 119 and variable current source 124 produce a signal to base 126 of limited slope. The output state of each driver is determined by the current from sources 120 and 124. FIG. 10B shows the correspondence between driver output signal states DRIVE HIGH, DRIVE LOW and THIRD STATE and current sources 120 and 124.

When a third state driver output is desired, both current sources are off. When the controller desires to produce a high driver output it activates current source 120 to its selected level. This causes current from the variable current source 120 to flow to transistor 111 and the slope controller 119. As the slope control component begins to charge up, transistor 111 turns on and the driver output 118 follows the voltage on the slope control 119. The driver output voltage is approximately equal to the reference voltage PULSE HIGH. The slope steepness is controlled by the amount of current, and the choice of the slope controller. When controller 96 desires a low driver output, it activates current source 124 to the selected level after turning current source 120 off. This turns off the top transistor 111 and turns on the bottom transistor 112 which connects the DRIVER OUTPUT at the low driver potential thereby applying a low or false state. In the preferred embodiment the variable current sources are controlled to provide either no current or one of two non-zero currents. The larger of these two non-zero currents results in a steeper slope of driver output that can be used in testing TTL and other high current circuits. The smaller of these two non-zero currents results in a slower rate of change in the driver output signal appropriate in avoiding CMOS latch-up when a CMOS circuit is under test. The slope control component in the preferred embodiment is a capacitor.

APPENDIX

An automatic method for determining the potential for damage due to in-circuit testing can be developed using simple thermal models for the IC junction and bondwire. Device data, such as thermal resistance, overdrive current, overdrive voltage and package type are required for the analysis and can be supplied by the test programmer. Test data, such as actual test duration and number of outputs potentially overdriven simultaneously are derived from a library of tests for digital devices.

The actual test duration is calculated knowing the maximum number of test steps which could be executed during the test, and the application rate of those test steps. Then, a constraint is calculated based on the lower time given by constraining the junction to a safe temperature rise (Equation 3), and constraining the bondwire to a safe temperature rise (Equation 8). If the actual test time is greater than this temperature rise constraint, then the potential for damage exists and the test system programmer should be notified.

The actual temperature rise of the junction and bondwire can be calculated by knowing the actual duration of the test using Equations 1 and 10. A cooldown requirement can then be calculated as the longer of the cooldown constraints based on junction cooling (Equation 5) and bondwire cooling (Equation 11). Because of the nature of these equations, they allow pre-cooling the overdriven parts prior to the test. As a result, no calculations are performed at execution time, and the safe execution of the tests remains order independent.

In addition to automatically evaluating each test for potential damage, an in-circuit tester can also minimize the potential for damage by intelligently selecting fixture interface points, optimal overdrive voltages and optimum edge speeds.

If the safe constraints for voltage overshoot and undershoot, junction temperature rise and bondwire temperature rise are met, then a 1 msec in-circuit test will contribute to no more than 2 seconds of normal device lifetime. However, if any of these constraints are violated, the potential for damage and the amount of lifetime degradation increases dramatically.

THE IN-CIRCUIT TEST

Before discussing the potentially harmful effects of in-circuit testing, it will be useful to define the test technique and understand why it is popular. Digital in-circuit testing allows digital devices to be tested as though they are separated from surrounding circuitry. This electrical isolation is obtained by forcing node states required by the test onto the input nodes of the device under test and looking for an expected response at its outputs. When an input node is not in agreement with the forced state, the output of the 'upstream' or driving, device must be overdriven. The amount of current required to overdrive this device is usually in excess of normal currents specified by manufacturers.

For most devices, forcing a high output state to a low state is equivalent to short-circuiting the output to ground; current flows out of the device and into the tester. When forcing a low output state to a high state, sufficient current must be supplied by the tester and backdriven into the device. The highest potential for failure as a result of overdrive current or the resulting temperature rise exists at the output stage of the overdriven device and not necessarily at the device under test. These failures will most commonly appear as bondwire failures or junction failures.

Visibility into the circuit being tested is gained through the use of a bed-of-nails fixture. This fixturing technique is a very convenient and effective way of gaining electrical access to each node in the circuit being tested. However, this fixturing interface can also lead to signal degradation. Signal degradation can compromise the quality of the in-circuit test, and potentially damage parts susceptible to voltage overshoot and undershoot. If the voltage at an input or output of a CMOS device is greater than the positive power supply voltage or less than the negative power supply voltage, the device can potentially be destroyed by CMOS latchup.

If an in-circuit test can contribute to damage in a device due to current flow, temperature rise, and voltage over/undershoot, why is it in such popular use today? There are three overriding answers to that question.

First, in-circuit testing is very effective at finding the types of faults that occur most commonly during the assembly of a printed circuit board. It is the lowest cost solution for finding solder shorts, wrongly inserted components, components damaged during the assembly process, and missing or incorrect components. In addition, in-circuit testing can also be effective at finding bad or marginal components, operational faults, and detecting process problems and trends.

The second major reason in-circuit testing is popular is the ease with which in-circuit test programs can be generated. A test program for a digital component is simply selected from a library of tests. The programmer does not have to understand the operation of the board or be able to generate stimulus that is meaningful while testing the board. In-circuit testing is highly compatible with automatic methods for test generation, and vendors of in-circuit test equipment are taking full advantage of that compatibility.

Finally, in-circuit testing is popular because it inherently produces component level diagnostic messages. If a device is isolated from surrounding circuitry through the node forcing technique, and that device fails a test of its operation, then that device is bad. Sophisticated backtracing routines are not needed for high confidence failure messages.

FAILURE MECHANISMS

Table I is a list of the failure mechanisms most likely to cause device failure or significant degradation of device lifetime during in-circuit testing. Each of these failure mechanisms is accelerated by one or more of the three failure accelerators discussed above; current, temperature and voltage.

Device damage can be broken into two categories. Lifetime degradation may occur during a test such that the device passes during testing and works properly in the final product, but fails prematurely in the customer's hands. The second type of damage is catastrophic, such that the device is damaged during testing and it will not operate properly in the product.

Each of the failure mechanisms in Table I were analyzed for their potential for both lifetime degradation and catastrophic failure during testing. The objectives of the research were to derive the worst case overdrive conditions under which the test might be executed, and under those conditions (subject to some imposed test constraints), minimize the potential for damage to devices during in-circuit testing. It was desirable to do this using device parameters readily available in manufacturer's data sheets, and to make the damage analysis automatic and flexible, anticipating its use for custom or proprietary parts.

OVERDRIVE CURRENTS

An emperical method was used to derive the worst case overdrive currents required by various logic families. Schematics of the internal circuitry of devices were analysed for worst case overdrive requirements. The results of the analysis are shown in Table II.

It is important to realize that when several outputs are being overdriven in a similar manner simultaneously, the sum of the individual overdrive currents will flow through a power supply bondwire in the device. For example, if 16 address lines on a MOS microprocessor are simultaneously overdriven from a low to a high state, up to 2.8 amps of current could be required to flow through the Vcc bondwire of the processor.

TEST CONSTRAINTS

Some constraints are imposed on the in-circuit test before the analysis of failure mechanisms is done. The junction temperature of an IC should never be allowed to exceed the manufacturer's specified maximum. Prior to a test, the junction will always be some temperature above ambient. A typical maximum ambient rating is 75° C. If the corresponding maximum junction temperature rating is 125° C., and both specifications are to be met, then the junction must be less than 50° C. above ambient. For a test environment ambient of 25° C., the junction would be less than 75° C., and a 50° C. rise is allowed before exceeding the manufacturer's specification of 125° C. Therefore, the temperature rise of the junction should be restricted to 50° C. or less during an in-circuit test.

Another constraint imposed on the test is the restriction of bondwire temperature rise. The constraint on bondwire rise is to restrict the absolute temperature to less than 40% of the lowest melting point of the various bondwire materials. Bondwires are made from one of two materials; aluminum or gold. Because of material interactions between aluminum wire and plastic encapsulants, gold wire is always used in plastic packages. Aluminum or gold wire may appear in ceramic packages, but aluminum yields the worst case thermal analysis and is always assumed to be in ceramic packages throughout this research. The melting point for gold is 1060° C., and the melting point of aluminum is 660° C. So, the bondwire temperature should be restricted to a maximum of 264° C., or about a 230° to 240° C. rise. By restricting the temperature rise to 200° C., or less, the amount of wire flexure during testing is kept to a minimum, and the wire is never in danger of melting.

LIFETIME DEGRADATION

If the constraints on bondwire and junction temperature rise are met during an in-circuit test, estimates of consumed lifetime can be empirically derived. Increasing the stress on a part as a result of current, temperature or voltage, usually results in exponentially increased degradation. This relationship is expressed for temperature accelerated failure mechanisms by the Arrhenius model, and similar models are available for current and voltage accelerated failures mechanisms.

The lifetime degradation of a part during in-circuit testing is expressed in equivalent normal lifetime consumed by operating the device at stressed levels. For example, a 1 msec in-circuit test (under the above constraints) will contribute to no more than 185 msec of device lifetime consumption as a result of electromigration failure acceleration. Table III shows the result for the other failure mechanisms under consideration. When the effects of all the failure mechanisms are considered together, a 1 msec test will contribute to no more than 750 msec of normal device lifetime for bipolar devices, and no more than 2000 msec of lifetime for MOS devices.

References 1-26 contain data used in the analysis summarized in Table III.

CATASTROPHIC DAMAGE

Bondwire failure or junction failure due to temperature rise, and CMOS device latchup due to degraded test signals are the catastrophic failures most likely to occur during in-circuit testing. The potential for damage from temperature related failures is minimized by adhering to the temperature rise constraints discussed earlier. If these constraints are exceeded by a test then the risk of device damage increases dramatically.

This article will not discuss in detail the variety of ways in which signal quality can be maintained on an in-circuit test system. However, there are three items which must be considered—overdrive levels, signal rise times, and fixturing techniques. Overdrive levels should be high enough to maintain adequate noise margins, yet also maintain a margin between the peak signal voltage and the power supply voltage. By slowing signal rise times somewhat, less overshoot will occur at the device being tested. However, fast rise times must be available when testing logic like Schottky. Finally there is a variety of fixturing techniques which can minimize signal degradation. These include: impedance matching, sufficient ground returns, driver and ground placement, and fixturing materials.

In order to detect when a test might potentially damage overdriven parts as a result of temperature rise, it is necessary to perform a thermal analysis on the device being overdriven. The thermal analysis predicts the temperature rise during the test. If this rise is greater than the constraining safe rise, derived above, then the potential for damage exists and the programmer should be notified.

MODEL DEVELOPMENT

Figure 12:
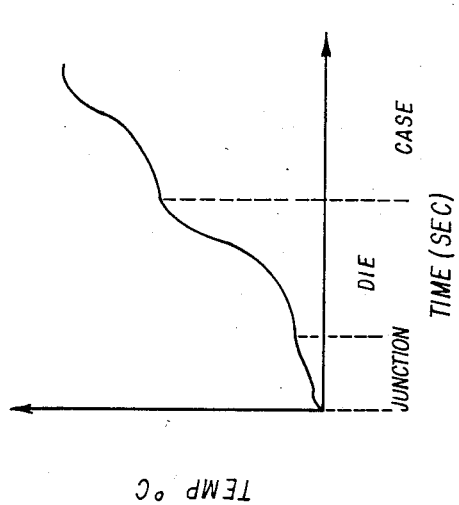

It is convenient to model thermal problems as electrical problems using the following analogies:
Thermal resistance=Electrical resistance
Thermal capacity=Electrical capacitance
Temperature rise=Voltage
Heat flow=Current The most accurate thermal model of an integrated circuit would be a lumped RC transmission line. A simplification of this complex model can be represented by FIG. 11. This model of FIG. 11 adequately predicts the 'three-humped' curve, FIG. 12, often shown in research on thermal response of ICs. However, most of the values required for the model of FIG. 11 are not generally specified by manufacturers.

Figure 11:
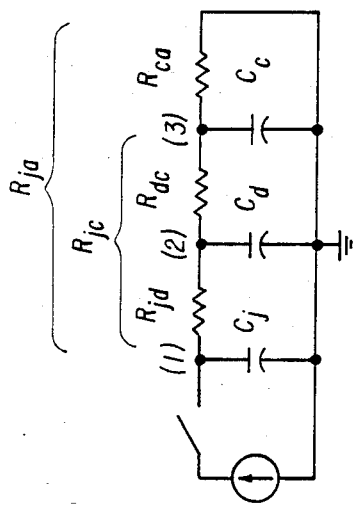

The model of FIG. 11 can be simplified further. With respect to other values in the thermal model, the junction thermal capacity (Cj) can be neglected. This thermal capacity is device specific, but for a junction 0.003 inches square by 0.00016 inches thick is about $5 \times 10^{-3}$ J/°C., and the thermal time constant is typically about $10 \times 10^{-6}$ seconds [27-28].

The package thermal capacity (Cc) can be modeled as a short circuit for pulses of short duration. Experimental evidence indicates that the thermal time constant for the package is 10 seconds or more. If the pulse duration is significantly less than 10 seconds then Cc is essentially a short circuit.

Figure 13:
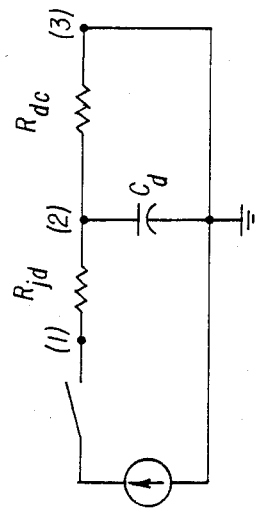

If package heating is ignored for a single pulse, and the junction thermal capacity is neglected then the thermal model becomes that shown by FIG. 13. Since the values of Rjd and Rdc cannot be determined explicitly, it is desirable to derive a proportional relationship of the two which gives the worst case thermal transfer model. A worst case model would describe the fastest way the junction could heat, and the slowest way it could cool.

Consider the case when the switch in FIG. 13 is closed and the voltage at node 1 (temperature at the junction) begins to rise. The fastest rise occurs when Rjd is small and Rdc is large. When the switch is opened, the slowest discharge also occurs when Rjd is small and Rdc is large. A worst case model exists if all of Rjc (Rjd+Rdc) is lumped into Rdc and Rjd is assumed to be zero. This yields the model shown in FIG. 14.

Figure 14:
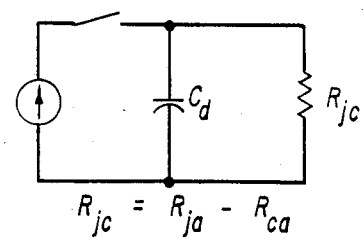

The model of FIG. 14 can be used to describe the behavior of a single output being overdriven assuming the package acts as a heat sink at a constant temperature during the overdrive period.

Figure 15:
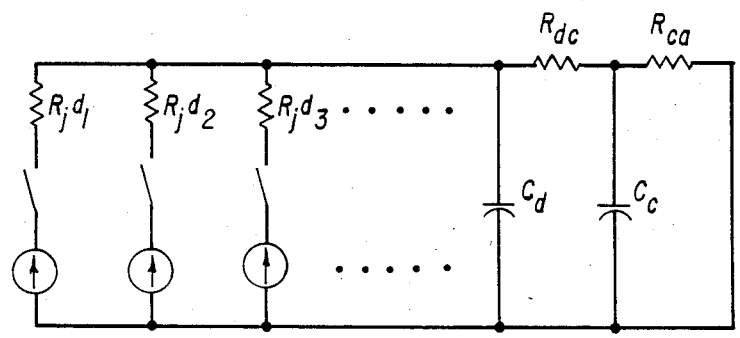

FIG. 15 shows a model of multiple output junctions being overdriven simultaneously. If there is no package heating, the model can, again, be simplified to that shown in FIG. 13 where the source is equal to the sum of the power being generated in each junction, and the junction to die* thermal resistance is Rjd/n, where n is the number of outputs being overdriven simultaneously. If this model is simplified to that shown in FIG. 14 it yields a conservative model for heat flow with multiple outputs overdriven. Since Rjd/n+Rdc (which is lumped into Rjc in the model) will always be less than the actual value of Rjc, the model is conservative. Future die shrinkages or technologies which put junctions closer together will be adequately covered by this model.

*silicon substrate

JUNCTION TEMPERATURE

Classical electrical equations can be used to describe both the heating and cooling of the junction based on the model of FIG. 14. Equation 1 can be used to calculate the junction temperature rise after time t.

$$\text{Trise} = P*Np*Rjc*(1-e^{(-t/(Rjc*Cd))}) \qquad \text{Equation 1}$$

Where:
Trise = temperature rise at time t.
P = overdrive power per output overdriven.
Np = number of outputs overdriven.
Rjc = thermal resistance junction to die.
Cd = thermal capacity of the die.
note:
P*Np*Rjc = steady state temperature (maximum temperature rise).
Rjc*Cd = thermal time constant.

The thermal capacity of the die is not a readily available parameter, but a reasonable value can be calculated from Equation 2 assuming a worst case die size, and knowing the heat capacity and density of silicon.

$$Cd = \text{Volume*Heat capacity*Density} \qquad \text{Equation 2}$$

Equation 1 can be solved for time, and can then be used to predict the amount of time a test can last before rising the junction temperature by some given amount, Trise. This relationship is shown in Equation 3.

$$t = -Rjc*Cd* \ln(1-\text{Trise}/(P*Np*Rjc)) \qquad \text{Equation 3}$$

Equation 3 can be used to predict the maximum test duration allowed to prevent heating a junction more than a predefined temperature rise, for a single test. But if the tester is looping on a test or for some other reason repetitively overdriving a device, heat can build up cumulatively. Even if a single test does not cause a temperature rise sufficient to violate the junction rise constraint, if the junction is not allowed to cool between tests, its temperature will eventually exceed the maximum specified by manufacturers.

The equation for the decay of the simple RC circuit shown in FIG. 14 is:

$$\text{Tcool} = To*e^{(-t/(Rjc*Cd))} \qquad \text{Equation 4}$$

Where:
Tcool = the temperature after time t.
To = the initial temperature.

The value of To could be obtained by adding the result of Equation 1 (using the actual test time for t) to the pretest temperature of the junction. Equation 4 could then be solved for time and the required time to cool to some acceptable temperature could be calculated. But this temperature must then be stored and used as the pre-test initial temperature in future heat and cool calculations. This requires that a considerable amount of data about the initial conditions of each part being overdriven are calculated and stored in real time.

A better way to calculate cool-down constraints is to assume the device is at its maximum allowed temperature rise before the test. The cool down time is then enforced prior to the test such that the junction is brought down to a temperature where the rise from the test will not allow the junction to exceed the maximum allowed temperature.

This makes the execution of the tests order independent and no initial temperatures need be calculated or stored. Required cool-down times can be precalculated before testing ever begins.

Equation 4 can be solved for time and the maximum allowed temperature substituted for To. Tcool becomes the actual temperature rise from the test calculated from Equation 1 using the catual test time for t. The actual test time is calculated knowing the maximum number of test steps in the test and the test step application rate.

$$t = -Rjc*Cd* \ln((Tmax-Tactual)/Tmax) \qquad \text{Equation 5}$$

The above equations ignore the effects of package heating. If a device is repectively overdriven, package heating can become significant. Experiments have shown that for up to 100 repetitive tests, the package will heat about 15° C. If the maximum allowed temperature rise is decreased by 15° C., then the above equations for junction heating and cooling will adequately predict maximum test durations and required cooling times for up to 100 repetitive tests. If more than 100 repetitions of a test are performed then an extended cool-down should be inserted to keep the package from rising by more than 15° C.

BONDWIRE TEMPERATURE

The two major types of wire-bonding material in use today are aluminum (usually alloyed with about 1% silicon) and gold. There are also two major package types in use—plastic and ceramic. Due to material interactions between aluminum and plastic encapsulants, gold bondwires are always used in plastic packages. Either gold or aluminum are used in ceramic packages but aluminum provides the worst case thermal analysis. Because the two packaging techniques have dramatically different thermal behavior, each type of package must be analyzed separately.

Figure 16:
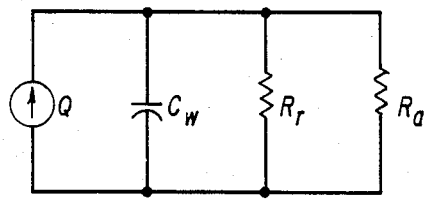

The gold bondwire in a plastic encapsulated package has two modes of heat transfer—radial conduction to the plastic encapsulant and axial conduction along the wire to the die and lead frame. If the die, lead frame and package are modeled as heat sinks at constant temperature, a simple heat transfer model can be constructed. Again, an electrical analogy can be used where heat flow is modeled by current, thermal resistance by a resistor, thermal capacity by a capacitor, and temperature rise by voltage. The heat transfer model is shown in FIG. 16. Radial conduction is modeled with Rr and axial conduction is modeled with Ra. Cw represents the thermal capacity of the wire. The current source represents the internal heat generation in the wire due to Joule heating.

The equation for temperature rise for a gold bondwire in a plastic package is given by:

$$T = Req*Q*(1-e^{(-t/(Req*Cw))}) \qquad \text{Equation 6}$$

where:
T=temperature rise of wire.
Cw=thermal capacity of wire.
Req=equivalent resistance of Rr in parallel with Ra.
Q=internal heat generation given by:

$$Q = I\wedge 2*Rw \qquad \text{Equation 7}$$

where:
I=the current through the wire.
Rw=the resistance of the wire.

Rw will vary with temperature, so Equation 6 must be solved iteratively. Values for Ra and Rr can be derived using the methods of reference [29] pages 31-33, and 63-67 respectively.

Solving Equation 6 for time yields Equation 8. This equation predicts the maximum test duration allowed to restrict the temperature rise in the bondwire to T degrees Celsius. The equation is invalid for overdrive currents which cause the value of [1−T/(Req*Q)] to be less than zero. Such currents are below the steady state current carrying capability of the wire.

$$t = -Req*Cw* \ln(1 - T/(Req*Q)) \qquad \text{Equation 8}$$

Figure 17:
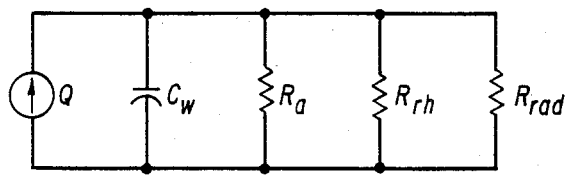

The aluminum bondwire in a ceramic package has three modes of heat transfer. Heat can be transfered by radial free convection to the air in the package, axial conduction along the wire to the die and lead frame, and radial radiation into the package. If the package, lead frame and die are modeled as infinite heat sinks and air as assumed to remain at constant temperature, the heat transfer can be modeled as shown in FIG. 17. Rrh represents the radial convection thermal resistance, Ra is axial conduction thermal resistance, and Rrad is radical radiation thermal resistance.

Equation 8 can also be used to determine the maximum test duration allowed to restrict the temperature rise to T, for aluminum bondwires in a ceramic package. Req is Rrh, Ra and Rrad in parallel, Cw is the thermal capacity of the bondwire. Values for Rrh, Ra, and Rrad can be determined using the methods of reference [29] pages 237-240, 31-33, and 342 respectively.

Equations for bondwire cooling are derived in the same way as Equations 4 and 5. Steady state temperature (Tss) is given by:

$$Tss = Rw*Req*(I*Np)\wedge 2 \qquad \text{Equation 9}$$

The actual temperature rise in the wire as a result of the test is:

$$Tactual = Tss*(1 - e^{(-ta/(Req*Cw))}) \qquad \text{Equation 10}$$

And the cool-down time required prior to the test is given by Equation 11:

$$t = -Req*Cw* \ln((Tmax - Tactual)/Tmax) \qquad \text{Equation 11}$$

TABLE I

| Failure Mechanisms | Accelerated By |
|---|---|
| Bulk Failures | |
| Second Breakdown | Temperature |
| Metallization Failures | |
| Electromigration | Temperature, Current |
| Corrosion | Temperature |
| Interaction with Other Materials | Temperature |
| Surface Reconstruction | Temperarure |
| Si and Si/SiO$_2$ Interface Failures | |
| Dielectric Breakdown | Temperature, Voltage |
| Surface Charge Accumulation | Temperature |
| Charge Injection | Temperature, Voltage |
| Bonding Failures | |
| Intermetallic Growth | Temperature |
| Thermal Fatigue | Temperature |
| Chip Mount Failures | |
| Thermal Fatigue | Temperature |
| Unique Failures | |
| CMOS Latchup | Voltage |
| Source-Drain Punchthrough | Voltage |
| SiO$_2$ Breakdown | Voltage |
| Bondwire Failure | Temperature, Current |

TABLE II

Theoretically Derived Worst Case Overdrive Currents
Values are in mA, per pin overdriven

| Family | Iod | Normal Output Current | Iod/Normal |
|---|---|---|---|
| TTL | 272 | 16 | 17 |
| LTTL | 23 | 4 | 6 |
| HTTL | 529 | 20 | 26 |
| STTL | 273 | 20 | 14 |
| LSTTL | 270 | 8 | 34 |
| ASTTL | 720 | 48 | 15 |
| ALSTTL | 270 | 8 | 34 |
| CMOS | 4 | 1 | 4 |
| ECL | 215 | 40 | 5 |

Note: For buffers, line drivers or other high current devices, the overdrive current can be larger than the values shown in this table.
MOS data is not given since it varies considerably from device to device and with the value of Vdd. If Vdd is restricted to 5 Volts then no ratios of greater than 34 were observed, so LSTTL and ALSTTL show the greatest current ratios. The worst case observed value for MOS is 175 mA.

TABLE III

| Failure Mechanism | Comments |
|---|---|
| Second Breakdown | Triggering temperature is well above maximum temperature experienced during properly designed in-circuit test. |
| Electromigration | A 1 ms test will contribute to no more than 185 ms of normal operation. |
| Corrosion | A 1 ms test will contribute to no more than 25.8 ms of normal operation. |
| Interaction with Other Materials | Reaction rate is insignificant under in-circuit test conditions. |
| Intermetallic Growth | A 1 ms test will contribute to no more than 296 ms of normal operation. |
| Surface Reconstruction | An in-circuit test will not cause sufficient thermal cycling for the onset of this failure mechanism. |
| Dielectric Breakdown | A 1 ms test, under appropriate voltage level constraints, will contribute to no more than 9 ms of device lifetime. |
| Surface Charge Accumulation | A 1 ms in-circuit test will contribute to no more than 1500 ms of device lifetime in MOS devices and 226 ms of lifetime in bipolar devices. |
| Charge Injection | Not significant during in-circuit test, under normal conditions. |
| Thermal Fatigue | Not a problem if temperature rise is restricted. Potential for failure varies with bondwire and package material. |
| CMOS Latchup | An appropriately designed in-circuit test will not cause CMOS latchup. |
| Source - Drain Punchthrough | In-circuit test voltages are not of sufficient magnitude to cause this |

TABLE III-continued

| Failure Mechanism | Comments |
| --- | --- |
| | failure. |
| SiO$_2$ Breakdown | In-circuit test voltages are not of sufficient magnitude to cause this failure. |

[1] W. E. Newell, "Dissipation in Solid-State Devices—The Magic of I^2," IEEE Transactions on Industry Applications, Vol. 1A-12, No. 4, July/August 1976.

[2] Harry S. Schafft, "Second Breakdown—A Comprehensive Review", Proceedings of the IEEE, Vol. 55, No. 8, August 1967, pp. 1272-1288.

[3] A. S. Grove, Physics and Technology of Semiconductor Devices, New York: Wiley, 1967.

[4] J. R. Black, "Electromigration—A Brief Survey and Some Recent Results", IEEE Transactions on Electron Devices, Vol ED-16, No. 4, April 1969, pp. 338-347.

[5] F. M. d'Heurle "Electromigration and Failure in Electronics: An Introduction", Proceedings of the IEEE, Vol. 59, No. 10, October 1971, pp. 1409-1418.

[6] J. M. Poate, et. al., Thin Films—Interdiffusion and Reactions, New York: Wiley, 1978, pp. 243-303.

[7] A. T. English, K. L. Tai, and P. A. Turner, "Electromigration In Conductor Stripes Under Pulsed DC Powering", Applied Physics Letters, Vol. 21, No. 8, October 1972.

[8] J. R. Davis, "Electromigration in Aluminum Thin Films Under Pulsed Current Conditions", Proceedings of the IEEE, Vol. 123, No. 11, November 1976, pp. 1209-1212.

[9] R. J. Miller, "Electromigration Failure Under Pulse Test Conditions", 16th Annual Proceedings Reliability Physics, 1978, pp. 241-247.

[10] E. Kinsbron, C. M. Melliar-Smith, A. T. English, and T. Chinoweth, "Failure of Small Thin Film Conductors Due to High Current Density Pulses", 16th Annual Proceedings Reliability Physics, April 1978, pp. 248-254.

[11] E. Philofsky and E. L. Hall, "A Review of the Limitations of Aluminum Thin Films on Semiconductor Devices", IEEE Transactions on Parts, Hybrids and Packaging, Vol. PHP-11, No. 4, December 1975, pp. 281-290.

[12] C. G. Peattie, et. al., "Elements of Semiconductor-Device Reliability", Proceedings of the IEEE, Vol. 62, No. 2, February, 1974, pp. 151-156.

[13] S. J. Horowitz and I. A. Blech, "The Incubation Time for Hole Formation Due to Electromigration in Al and Al/Cu/Al Thin Films", Journal of Electronic Materials, Vol. 4, No. 6, 1975.

[14] P. B. Ghate, W. R. Gardner, and D. L. Crosthwait, "Reliability Studies on the 2-Level Al/SiO$_2$/Al System", IEEE Transactions on Reliability, Vol. R-22, No. 4, October 1973, pp. 186-196.

[15] D. S. Peck, "Practical Applications of Accelerated Testing—Introduction", 13th Annual Proceedings Reliability Physics, 1975.

[16] E. M. Philofsky and K. V. Ravi, "On Measuring the Mechanical Properties of Aluminum Metallization and Their Relationship to Reliability Problems", 11th Annual Proceedings Reliability Physics, 1973.

[17] D. L. Crook, "Method of Determining Reliability Screens for Time Dependent Dielectric Breakdown", 17th Annual Reliability Physics Symposium, 1979.

[18] G. M. Johnson, "Accelerated Testing Highlights CMOS Failure Modes", EASCON 1976 Record, pp. 142A-1421.

[19] D. S. Peck and O. D. Trap, Accelerated Testing Handbook, Technology Associates, 1978.

[20] B. Euzent, "Hot Electron Injection Efficiency in IGFET Structures", 15th Annual Reliability Physics Symposium, 1977.

[21] G. G. Harman, "Metallurgical Failure Modes of Wire Bonds", 12th Annual Proceedings Reliability Physics, 1974.

[22] M. F. Nowakowski, F. Villella, "Thermal Excursion Can Cause Bond Problems", 9th Annula Proceedings Reliability Physics, 1971.

[23] G. A. Lang, B. J. Fehder, W. D. Williams, "Thermal Fatigue in Silicon Power Transistors", IEEE Transactions on Electron Devices, Vol ED-17, No. 9, September 1970, pp. 787-793.

[24] M. A. Miner, "Cumulative Damage in Fatigue", Transactions ASME, Vol. 67, 1945, pp. A159-A164.

[25] S. M. Sze, Physics of Semiconductor Devices, New York: Wiley, 1967.

[26] R. S. Muller and T. I. Kamins, Device Electronics for Integrated Circuits, New York: Wiley, 1977.

[27] D. W. Raymond and J. S. Smith, "IC Response to Transient Current Overloads", from a paper presented at the Advanced Techniques and Failure Analysis Symposium (ATFA), Sept., 1977.

[28] Louis J. Sobotka, "The Effects of Backdriving Digital Integrated Circuits During In-circuit Testing", Proceedings of IEEE International Test Conference, 1982, p. 270.

[29] J. P. Holman, Heat Transfer, 4th Edition, 1976, McGraw-Hill, Inc., New York.

We claim:

1. An improved method of testing circuits consisting of devices of the type in which test signals are applied directly to each device under test and output signals from each device under test are monitored, wherein the improvement comprises the additional step of introducing, between the application of test signals for each device, a predetermined variable length cool down time interval determined from characteristics of the devices and the circuit sufficient to avoid damage to the circuit due to overheating of devices of the circuit.

2. A method as in claim 1 wherein the predetermined variable length cool down time interval is determined by the steps of calculating the minimum time duration for each cool down time interval sufficient to avoid damage to any device of the circuit.

3. A method as in claim 1 wherein the predetermined variable length cool down time interval is introduced before the application of the test signals to the device under test for which the time interval was determined.

4. A method for preventing the overheating of an electronic device under test with initialization test signals during an initializing period or regular test signals during a testing period, the method comprising: counting the number of times the initialization test signals are applied to the electronic device under test, measuring the duration of the testing period and terminating the application of test signals when a predetermined count or a predetermined period has been reached.

5. A circuit tester for testing circuits consisting of devices, the circuit tester comprising:
   means for applying test signals to each device under test;

means for monitoring signals from each device under test; and means for introducing a predetermined variable length cool down time interval determined from characteristics of the devices and the circuit between the application of test signals for each device sufficient to prevent damage to any of the devices of the circuit due to overheating.

6. A circuit tester as in claim 5 further comprising:

data flies containing information of circuit topology and safeguard parameters of circuit devices;

a damage analyzer responsive to the information in the data files for calculating minimum length cool down time intervals sufficient to prevent overheating damage; and a controller responsive to signals from the damage analyzer to control the length of each cool down time interval.

7. A circuit tester as in claim 5 wherein the means for introducing the predetermined variable length cool down time interval is operative for introducing the time interval before the application of the test signals to the device under test for which the time interval was determined.

8. A circuit tester as in claim 7 further comprising means for varying the slope of the test signal applied to the device under test.

* * * * *